United States Patent [19]
Jenne

[11] Patent Number: 6,097,618
[45] Date of Patent: Aug. 1, 2000

[54] APPARATUS AND METHOD FOR CORRECTING DATA IN A NON-VOLATILE RANDOM ACCESS MEMORY

[75] Inventor: Fredrick B. Jenne, Los Gatos, Calif.

[73] Assignee: Cypress Semiconductor Corporation, San Jose, Calif.

[21] Appl. No.: 08/988,942

[22] Filed: Dec. 11, 1997

[51] Int. Cl.$^7$ ..................................... G11C 5/06
[52] U.S. Cl. ................. 365/63; 365/52; 365/230.02
[58] Field of Search ............ 365/52, 63, 230.02

[56] References Cited

U.S. PATENT DOCUMENTS

| | | | |
|---|---|---|---|
| 3,906,464 | 9/1975 | Lattin | 340/173 |
| 4,000,413 | 12/1976 | Wong et al. | 307/208 |
| 4,051,388 | 9/1977 | Inukai | 307/279 |
| 4,096,584 | 6/1978 | Owen, III et al. | 365/227 |
| 4,110,639 | 8/1978 | Redwine | 307/279 |
| 4,146,802 | 3/1979 | Moench | 307/279 |
| 4,149,099 | 4/1979 | Nagami | 307/279 |
| 4,216,395 | 8/1980 | Beecham et al. | 307/350 |
| 4,262,219 | 4/1981 | Richard | 307/262 |
| 4,291,242 | 9/1981 | Schriber | 307/270 |
| 4,347,448 | 8/1982 | Plachno | 307/583 |
| 4,433,252 | 2/1984 | Lewis | 307/269 |
| 4,472,643 | 9/1984 | Furuyama | 307/269 |
| 4,716,552 | 12/1987 | Maltiel et al. | 365/222 |
| 5,517,448 | 5/1996 | Liu | 365/230.02 |
| 5,621,696 | 4/1997 | Dhong et al. | 365/63 |
| 5,793,684 | 8/1998 | Yach | 365/63 |

*Primary Examiner*—Son T. Dinh
*Attorney, Agent, or Firm*—Blakely, Sokoloff, Taylor & Zafman LLP

[57] ABSTRACT

An architecture for data correction that may be used in non-volatile random access memories. In one embodiment, a circuit configured to be responsive to a control signal and to provide bitline outputs in response to bitline inputs is provided. The states of the bitline outputs depend upon the states of the bitline inputs and the control signal. The control signal may be provided by a non-volatile static random access memory (SRAM) cell. The circuit may include inverting and non-inverting paths or may include crossing and passing circuitry. The crossing and passing circuitry connects a first input of the circuit to a second output of the circuit in response to a first state of the control signal and further connects the first input to a first output of the circuit in response to a second state of the control signal. The control signal may be generated by a control device such as a non-volatile random access memory cell. In other embodiments, the circuit is configured to select a first bit-line connection path or a second bit-line path according to the state of the control signal. If the control signal is in an active state, the first bit-line connection path is selected and if the control signal is in an inactive state, the second bit-line connection path is selected.

27 Claims, 8 Drawing Sheets

APPARATUS AND METHOD FOR CORRECTING DATA IN A NON-VOLATILE RANDOM ACCESS MEMORY

RELATED APPLICATION

This application is related to two co-pending applications, application Ser. No. 08/885,156, filed on Jun. 30, 1997, entitled "Non-Volatile Static Random Access Memory and Methods for Using Same" by K. Nirmal Ratnakumar and Fredrick B. Jenne and application Ser. No. 08/926,611, filed on Sep. 10, 1997, entitled "Non-Volatile Random Access Memory and Methods for Making And Configuring Same" by Fredrick B. Jenne. Both applications have been assigned to the Assignee of the present invention.

FIELD OF THE INVENTION

The present invention relates to non-volatile memory devices and, in particular, to automatic data correction for such devices.

BACKGROUND

Conventional read/write memories, for example static random access memories (SRAMs), as are commonly used in computer systems, lose their stored information when power is removed from the device.

FIG. 1 illustrates a computer system 50 that includes a conventional read/write memory 52. Memory 52 is coupled to a bus 54 that provides a communication path between memory 52 and a processor 56. In general, processor 56 uses memory 52 as a store of data and/or instructions. Computer system 58 may further include one or more functional units 58 which are coupled to bus 54. The functional units 58 may serve a variety of purposes, for example these units may be input/output (I/O) devices which transfer information (e.g., data and/or control signals) to/from processor 56 and/or memory 52. Further, functional unit(s) 58 may be (a) bus bridge(s) which provides a communication path between bus 54 and another bus (not shown), e.g., a system bus, within computer system 50. In such a configuration, bus 54 may serve as a local or processor bus.

FIG. 2 illustrates memory 52 in more detail. Memory 52 generally includes a memory core 60 which is made up of a number of memory cells. The cells of memory core 60 are accessed during read or write operations using bitlines 62 and wordlines 64. Word lines 64 are selected by row decoder 70 in response to address information on address lines 72. Address lines 68 and 72 may be part of bus 54. Similarly, the bitlines 62 are selected using a column decoder 66 which receives and decodes address information from a plurality of address lines 68.

During a memory write operation, data presented on Data In bus 74 may be applied to selected bitlines 62 through write path circuitry 76. (In general, portions of the write path circuitry may be shared by portions of the read path circuitry and, thus, the two are shown as a single block 76.) Individual cells of a column (associated with the selected bitlines) within memory core 60 are selected by appropriate wordlines 64 and the data from the Data In bus 74 is stored in one or more of the memory cells. During a memory read, data is read out of selected memory cells through read path circuitry 76 to a Data Out bus 78. Data In bus 74 and Data Out bus 78 may be the same bus (at least in part) and is/are coupled to bus 54. Read and write operations are controlled using one or more control signals 80 (from bus 54) which are decoded and/or buffered using control circuitry 82 to provide appropriate internal control signals 84 to the read/write path circuits 76.

A typical conventional read/write memory uses SRAM cells as its basic memory cells. Consequently, the memory loses all of its stored information if power is removed or temporarily lost. Accordingly, computer system designers have recognized the need to back up information stored in volatile memories in the event that power is lost, e.g., during a blackout or brownout.

One way to back up a volatile memory such as an SRAM is to transfer the data stored in the SRAM to a separate non-volatile memory before the power is turned off or is about to fail. Unfortunately, such a solution requires that the data be transferred bit-by-bit between the volatile memory and the non-volatile memory. Such a data transfer, which typically occurs over a slow, serial link, cannot accommodate the large amounts of data stored in modern SRAMs (e.g., of the order of 1–4 Mbits) before a complete failure of power.

A more desirable way to prevent loss of information stored in read/write memories is to use non-volatile static random access memory ("NVSRAM"). FIG. 3 illustrates a non-volatile static random access memory cell 100. Memory cell 100, its method of fabrication and its use are the subject of the above-mentioned related patent applications. Briefly, memory cell 100 includes four conventional NMOS transistors: $N_1$ and $N_2$ for pull-down and $S_1$ and $S_2$ for selecting or transferring data between the cell 100 and the bit lines BL and $\overline{BL}$. PMOS pull-up transistors $P_1$ and $P_2$ are stacked gate, double-poly transistors with a bottom tunnel dielectric, poly-silicon floating gate and a top poly-silicon control gate. The control gates and floating gates are isolated by a thin poly-to-poly coupling dielectric.

With a normal supply voltage (Vcc-Vss) across terminals $V_1$–$V_2$, memory cell 100 functions exactly like a conventional SRAM cell with unlimited, fast read/write operations. A non-volatile (NV) storage operation (as described in the above related patent applications) is shown in FIG. 4 and is enabled by boosting the supply voltage (Vcc-Vss) to a higher or programming voltage (Vpp-Vnn) approximately 2 (Vcc-Vss), such that $E_{ox}$, the field across the tunnel oxide, $\geq 8$ MV/cm for a specified time ($T_{STORE}$) of the order of 1–10 msec. Note that Vnn may be equal to Vss. During this time ($T_{STORE}$), electrons are injected by band-to-band not electron (BBHE) injection into the floating gate of the non-conducting stacked gate PMOS transistor while electrons tend to be removed by Fowler-Nordheim (F-N) tunneling from the floating gate of the conducting stacked gate PMOS transistor. Thus, charge is stored on the floating gate of the PMOS transistor undergoing BBHE injection while charge is removed from the floating gate of the PMOS transistor undergoing F-N tunneling. These details are explained further in the above-noted related patent applications.

At the end of a storage operation, there is an imbalance in the threshold voltages ($V_T$s) of the stacked gate PMOS transistors $P_1$ and $P_2$. The $V_T$ of the "OFF" (i.e., non-conducting) PMOS transistor becomes more positive due to BBHE injection while the $V_T$ of the "ON" (i.e., conducting) PMOS transistor tends to become negative due to F-N tunneling current. After the storage operation, Vcc can be removed indefinitely. During this power down time, the difference in the PMOS $V_T$s will be preserved.

Two features of this storage operation are:

1. The imbalance created in the $V_T$s of the PMOS transistors are opposite to their current conducting states, i.e., the $V_T$ of the non-conducting PMOS transistor is shifted towards the conducting state and vice-versa.

2. This kind of imbalance may be created for all the cells 100 in an entire memory core 60 during the storage operation.

As further shown in FIG. 4, a non-volatile (NV) recall operation (as described in the above-noted related patent applications) may be performed in two stages. On power up (Phase 1), the PMOS transistor with a less negative $V_T$ becomes conducting or "ON". This was the "OFF" PMOS transistor during the NV storage operation. Thus, on initial power up, the recalled state of cell 100 is the inverse of the cell state during the NV storage operation. To retrieve the original state of cell 100, one more NV storage operation (a "dummy" storage operation) is performed by raising Vcc to Vpp (and lowering Vss to Vnn if desired). This is followed by a power down period (Vcc is removed) and a second power up (Phase 2) during which the supply voltage to the cell 100 raised from 0 to Vcc. Due to the inversion of states during the dummy storage and recall (Phase 2 power up) operations, the state recalled after the Phase 2 power up is the same as the original state when the first storage operation was performed. Thus, the originally stored state of cell 100 is recovered.

Although the "dummy" storage operation allows the original state of memory cell 100 to be recovered, it takes time and also exposes the NVSRAM cell to two high voltage programming cycles, which reduces the reliability of the cell. Accordingly, what is desirable is a new scheme for recovering the originally stored state of an NVSRAM cell.

SUMMARY OF THE INVENTION

The present invention provides an architecture for automatically recovering a stored state of a non-volatile random access memory cell (or cells).

In one embodiment, a circuit that connects a first input of the circuit to a second output of the circuit in response to a first control signal and further connects the first input to a first output of the circuit in response to a second control signal is provided. The first and second control signals are generated by a control device. The control device may include a non-volatile random access memory cell, which is configured to store a reference state indicating states of non-volatile random access memories before power loss.

In a further embodiment, the circuit is configured to select a first bit-line connection path or a second bit-line path according to a logic state of a control signal. The control signal may be generated by a non-volatile memory cell. If the control signal is in an active state, the first bit-line connection path is selected and if the control signal is in an inactive state, the second bit-line connection path is selected.

Other embodiments of the present invention include a circuit configured to be responsive to a control signal and to provide bitline outputs in response to bitline inputs. The states of the bitline outputs depend upon the states of the bitline inputs and the control signal. The control signal may be provided by a non-volatile static random access memory (SRAM) cell. The circuit may include inverting and non-inverting paths or may include crossing and passing circuitry.

Further embodiments include a method wherein bitline outputs of a memory cell are configured to reflect a state stored in the memory cell prior to a power loss.

BRIEF DESCRIPTION OF THE DRAWINGS

The present invention is illustrated by way of example and not limitation in the figures of the accompanying drawings in which.

DETAILED DESCRIPTION

Described herein is an architecture for correcting data in a non-volatile random access memory ("NVRAM"). In one embodiment, a circuit connects a first input of the circuit to a second output of the circuit in response to a first control signal and further connects the first input to a first output of the circuit in response to a second control signal. The circuit may be positioned within a bitline connection path of a memory device. The circuit further includes a control device which generates the first and second control signals. The control device may be a non-volatile random access memory cell ("NVCell") configured to store a reference state prior to a power loss to the memory.

In a further embodiment, the circuit may be configured to select a first bit-line connection path or a second bit-line connection path according to a logic state of a control signal. The control signal may be generated by an NVCell. If the control signal is in an active state, the first bitline connection path is selected and if the control is in an inactive state, the second bitline connection path is selected. The first bit-line connection path connects a first input of the circuit to a second output thereof and a second input of the circuit to a first output thereof. The second bitline connection path connects the first input to the first output and the second input and the second output.

In another embodiment of the present invention, a circuit is configured to be responsive to a control signal. The circuit provides bitline outputs in response to bitline inputs and the states of the bitline outputs depend on the states of the bitline inputs and the control signal. The control signal may be provided by a non-volatile SRAM cell. The circuit may include a pair of control devices, each having an inverting and non-inverting bitline path or the circuit may include a passing circuit and a crossing circuit. Other embodiments are also described below to more fully illustrate the present invention.

Figure 5:
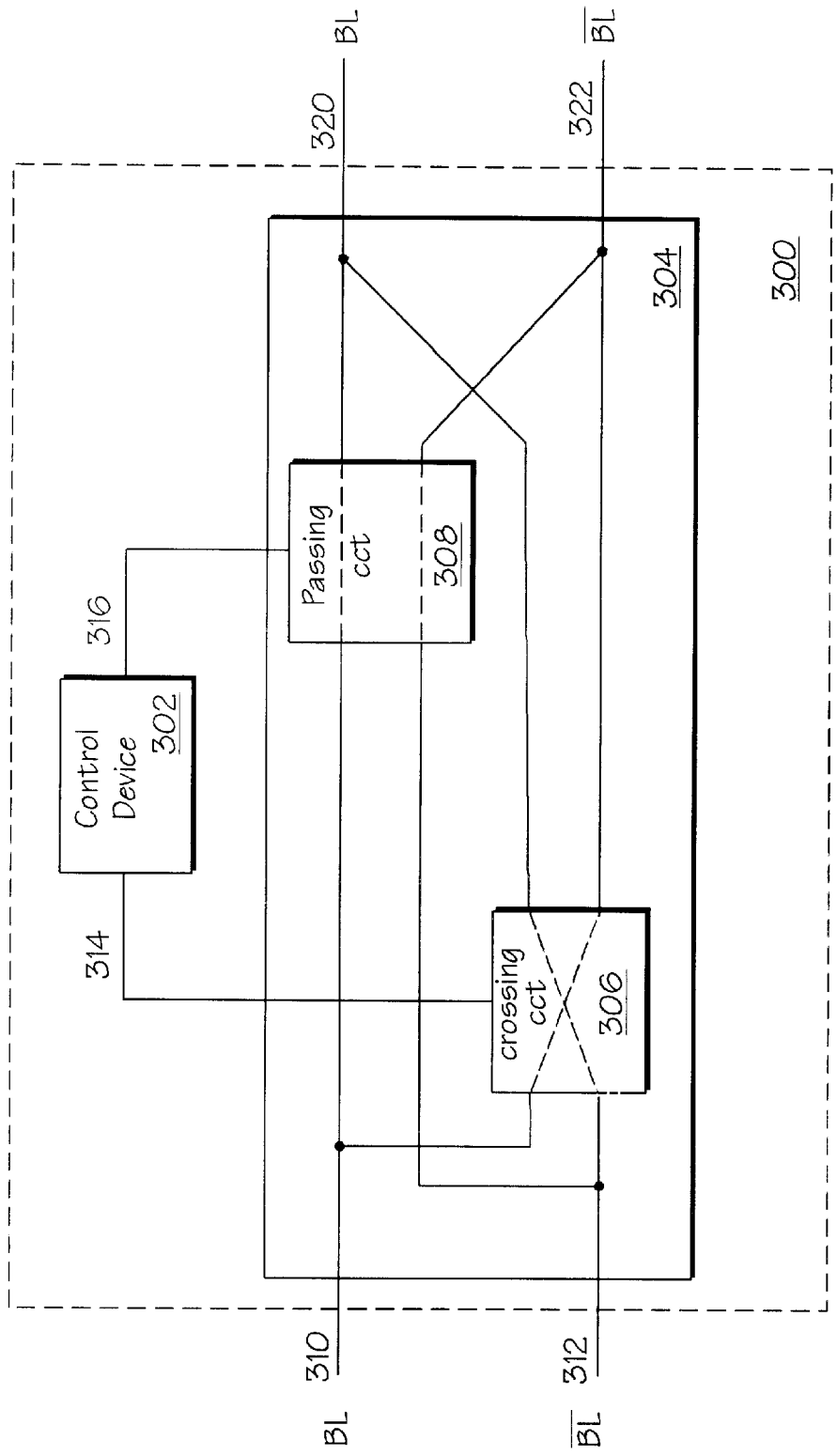
FIG. 5 illustrates a circuit for automatically recovering or correcting data from a non-volatile SRAM cell according to one embodiment of the present invention.

FIG. 5 illustrates a circuit 300 configured in accordance with one embodiment of the present invention. The circuit 300 is configured to connect a first input 310 to a second output 322 in response to a first control signal 314 and the first input 310 to a first output 320 in response to a second control signal 316. The first and second control signals 314 and 316 represent states of a control device 302. In one embodiment, circuit 300 may include a control device 302 and a switching circuit 304.

The switching circuit 304 is configured to connect the first input 310 to either the first output 320 or the second output 322 according to the state of the first control signal 314. The switching circuit 304 receives input signals from input bitlines BL and $\overline{BL}$ at the first and second inputs 310 and 312, respectively, and provides output signals for output bitlines BL and $\overline{BL}$ at the first and second outputs 320 and 322, respectively, according to the first and second control signals 314 and 316. When the first control signal 314 is in active state, the switching circuit 304 performs a crossing function, which connects the first and second inputs 310 and 312 to the second and the first outputs 322 and 320, respectively. Conversely, when the second control signal 316 is in active state, the switching circuit 304 performs a passing function by connecting the first and second inputs 310 and 312 to the first and second outputs 320 and 322, respectively. The crossing and passing functions may be performed by a crossing circuit 306 and a passing circuit 308, respectively.

The crossing circuit 306 is configured to receive the input bitline signals from first and the second inputs 310 and 312 and provides the output bitline signals at first and second outputs 320 and 322 in response to the first control signal 314. In other words, when the first control signal 314 is in an active state, the crossing circuit 306 provides the output bitline signals at first and second outputs 320 and 322 by connecting the first and second inputs 310 and 312 to the second and first outputs 322 and 320, respectively. When the second control signal 316 is in an active state, the passing circuit 308 is configured to provide the output bitline signals at the first and second outputs 320 and 322 by connecting the first and second inputs 310 and 312 to the first and second outputs 320 and 322, respectively.

The control device 302 may be configured to generate the first and second control signals 314 and 316 according to states stored in the control device 302. In general, the second control signal 316 is designed to be the logical complement of the first control signal 314. Thus, if the first control signal 314 is in an inactive state, the second control signal 316 is in an active state and vice-versa.

Figure 1:
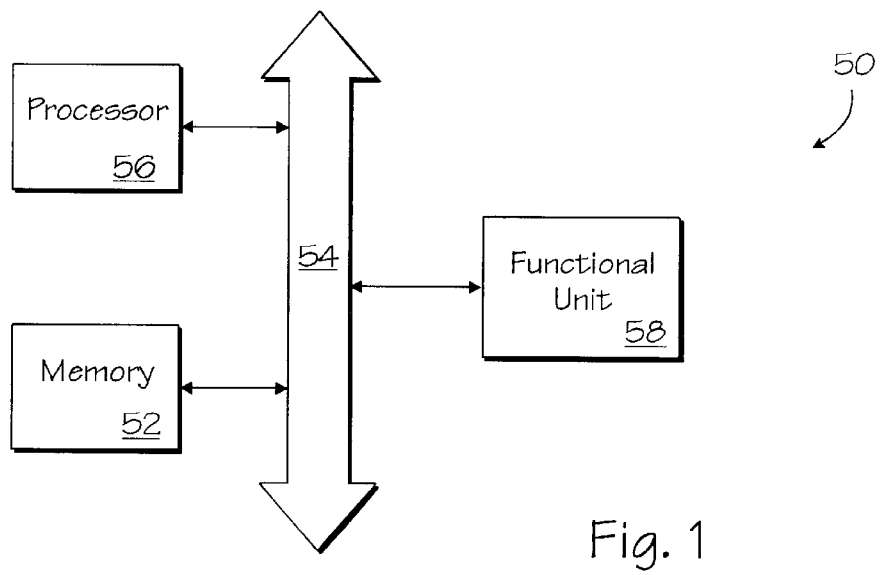
FIG. 1 illustrates a computer system including a memory and a bus.
Figure 2:
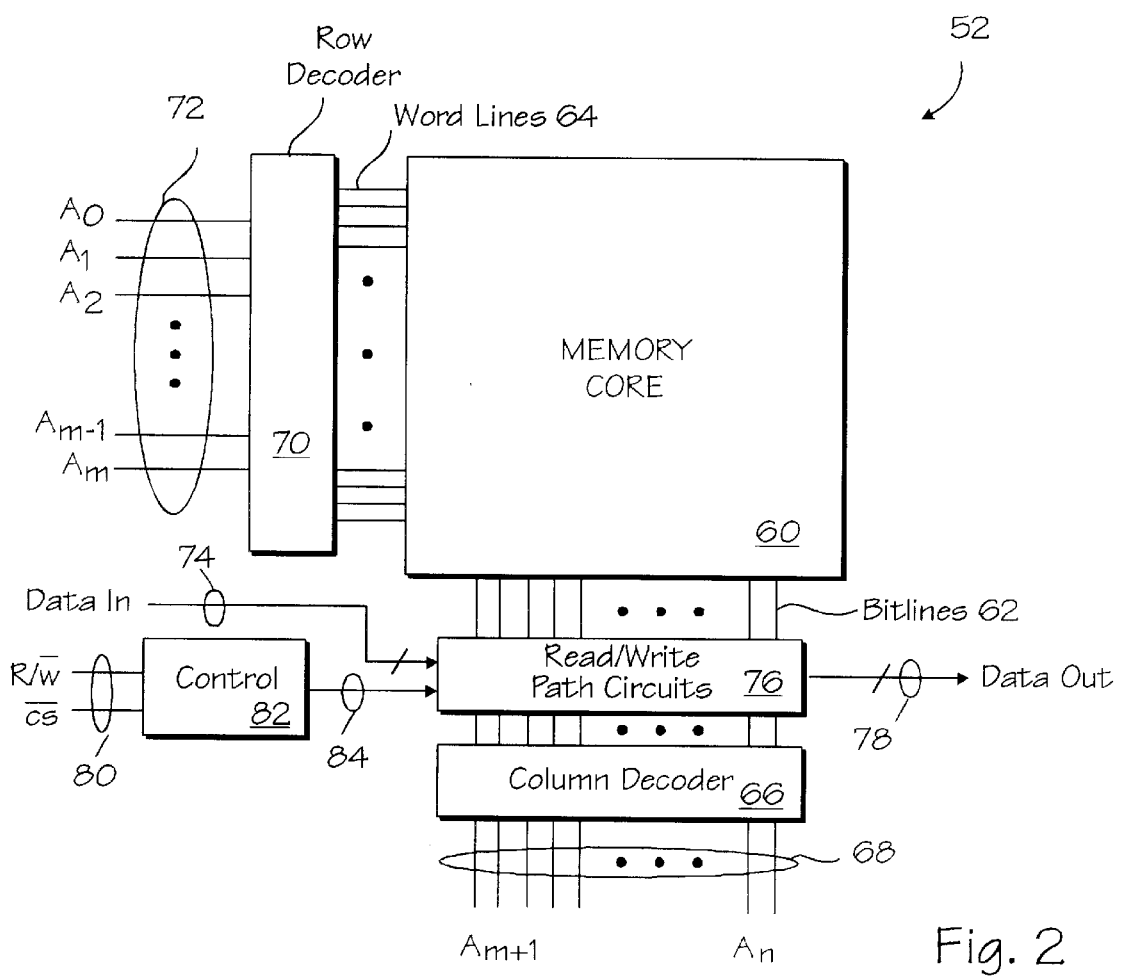
FIG. 2 illustrates a conventional memory for use in the computer system shown in FIG. 1.
Figure 3:
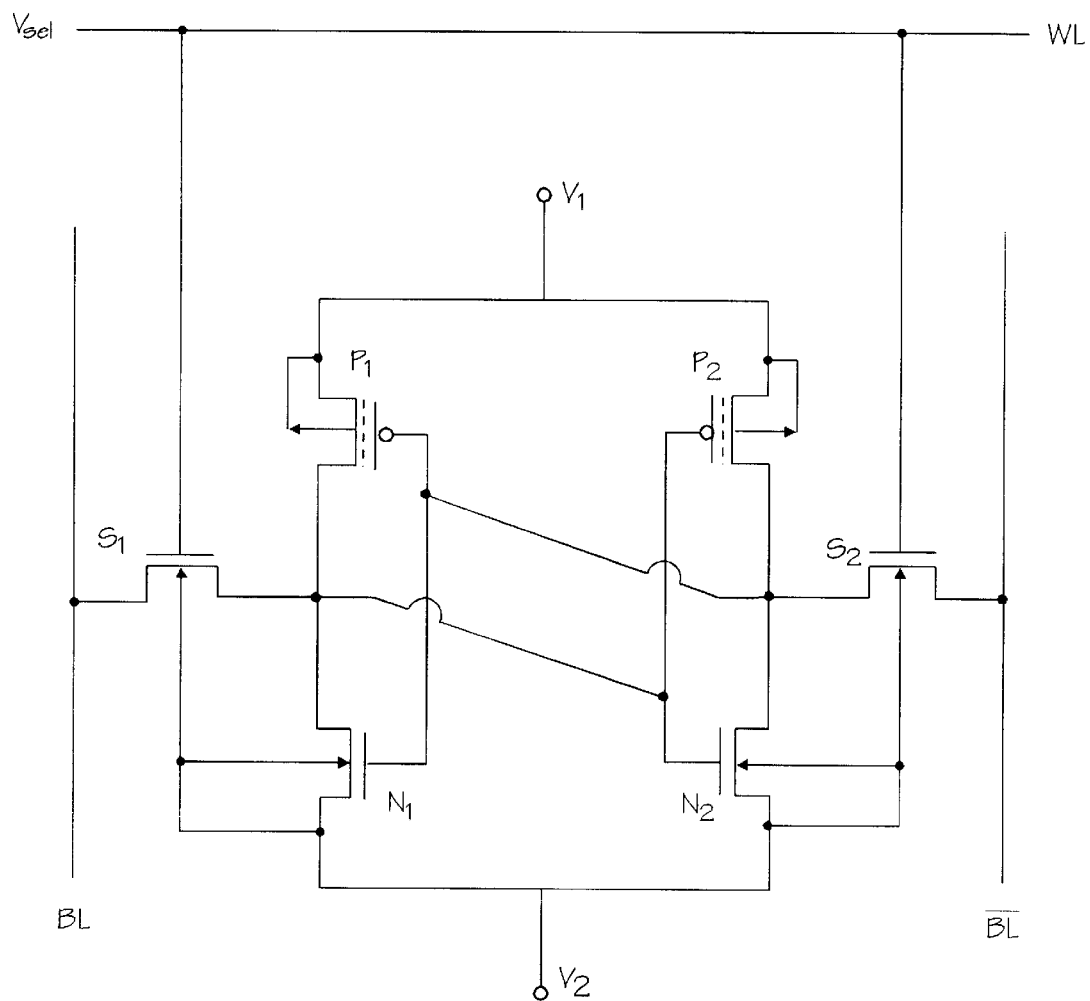
FIG. 3 illustrates a non-volatile SRAM cell.
Figure 4:
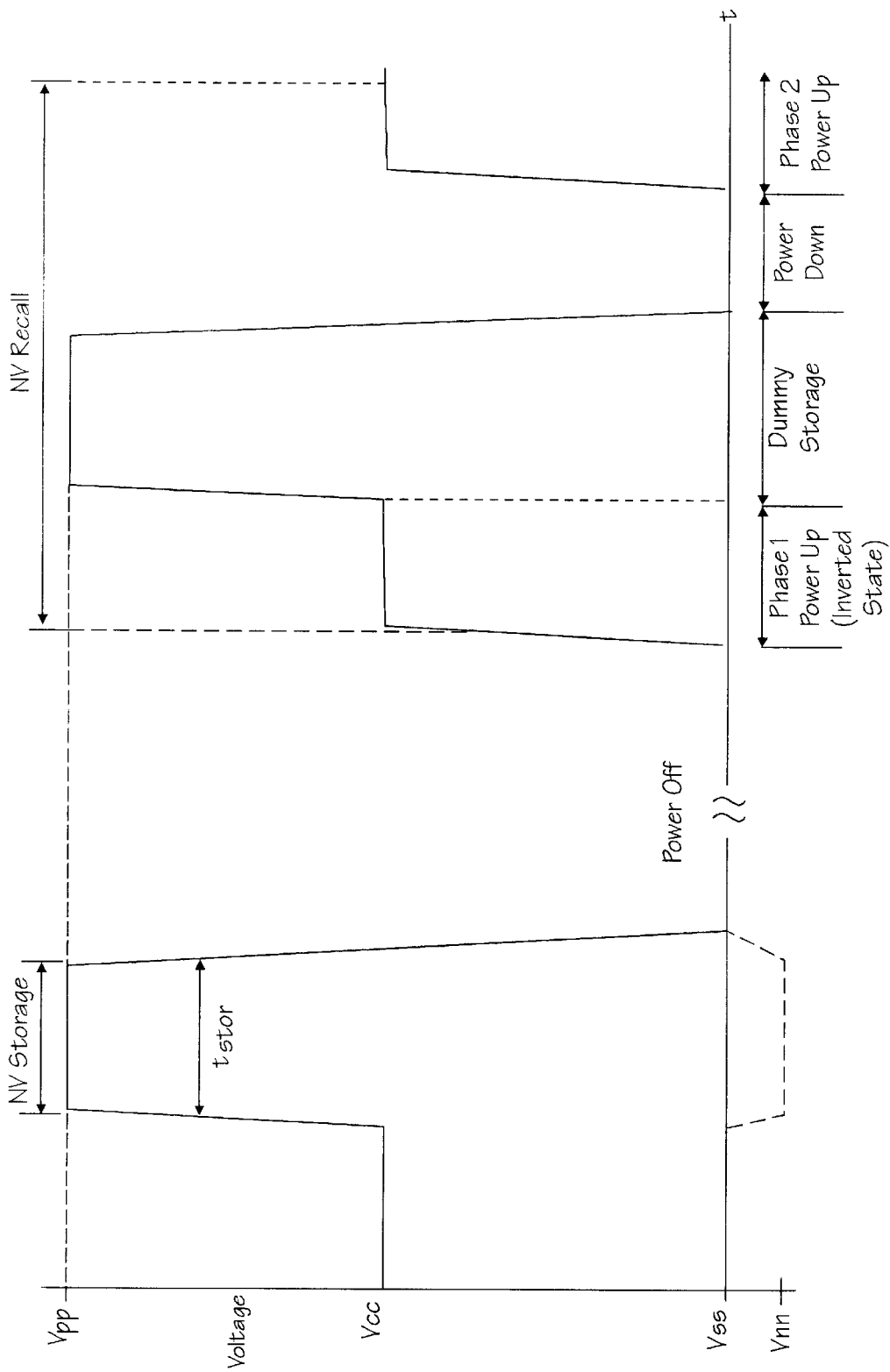
FIG. 4 illustrates a storage and recall cycle for a non-volatile SRAM cell.
Figure 6:
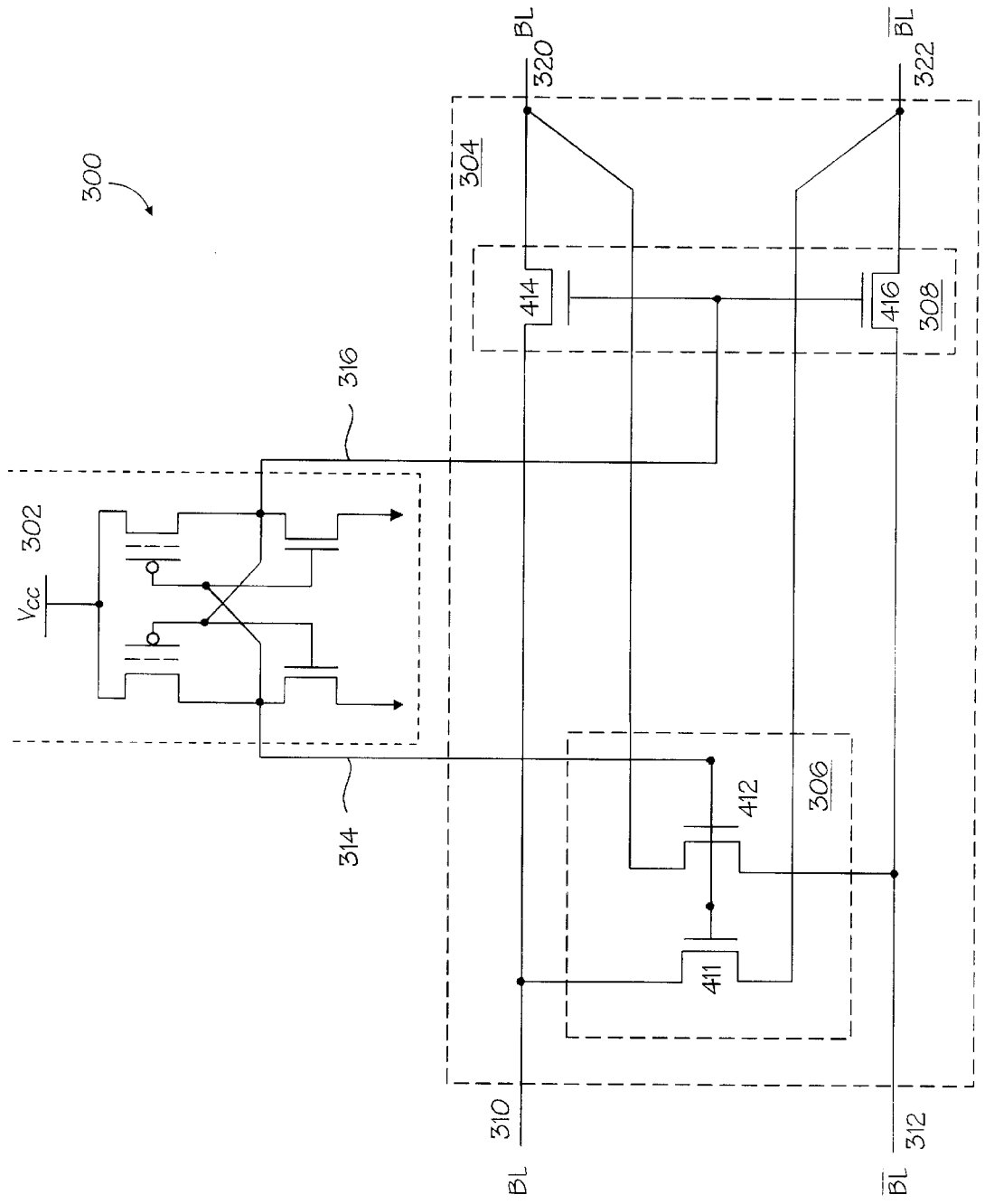
FIG. 6 illustrates the circuit of FIG. 5 in more detail according to one embodiment of the present invention.

FIG. 6 illustrates circuit 300 in more detail. As shown, for this embodiment control device 302 may be an NVCell. A detailed description of NVCell 302 can be found in the co-pending application Ser. No. 08/885,156, filed Jun. 30, 1997, entitled "Non-Volatile Static Random Access Memory and Methods for Using Same." The NVCell 302 is configured to store a reference state before a power loss (e.g., according to the above-described NV storage operation). The reference state is subsequently used to generate the first and second control signals 314 and 316, which are used to control the switching circuit 304. Since the first control signal 314 is logical complement of the second control signal 316, generating one control signal (e.g., for other embodiments of the present invention) may be sufficient. For example, a complement state of a single control signal may be generated by an inverter.

Where circuit 300 is located in a bitline path of a memory device (e.g., located between a memory cell or cells of a memory core and a read path of the memory), it may be used to automatically correct data stored in the memory as follows. Consider a memory having a plurality of NVCells in a memory core. Each of these cells is coupled to a bitline pair BL and $\overline{BL}$ as shown in FIG. 3. Now assume that circuit 300 is coupled to BL and $\overline{BL}$ at inputs 310 and 312. Outputs 320 and 322 are coupled to further read path circuitry of the memory. In operation, circuit 300 provides a bitline connection path from inputs 310 and 312 to outputs 320 and 322 according to the states of control signals 314 and 316.

Prior to a power loss, assume that the state of a memory cell or cells of the memory are stored (e.g., by raising their operating voltage to a programming voltage as described above). For purposes of this example, assume that the state so stored corresponds to a condition where bitline BL is at a higher potential then bitline $\overline{BL}$—a condition indicating that the memory cell stores a logic 1. During the storage operation, the operating voltage of NVCell 302 is also raised to a programming voltage level and the state of NVCell 302 is stored. Assume that this state corresponds to a situation where control signal 314 is inactive and control signal 316 is active. In such a case, circuit 300 provides a connection from input 310 to output 320 and from input 312 to output 322. Thus, the read path circuitry of the memory device receives signals on bitline BL and $\overline{BL}$ such that the potential on BL is higher than on $\overline{BL}$ and recognizes that the memory cell of the memory core stores a logic 1.

Now assume power is lost and subsequently restored. When the cells of the memory core power up after the power loss, they recover the inverse state to that which was stored (see above). Thus, for the above cell which stored a logic 1 prior to the power loss, it will now appear as though the cell stores a logic 0, i.e., the potential on $\overline{BL}$ at input 312 will be higher than the potential on BL at input 310. Circuit 300, however, does not pass this state to the read path circuitry of the memory device. Instead, because NVCell 302 also power up in its logical inverse state after the power loss, control signal 314 will now be active and control signal 316 will be inactive. This means that input 310 will be coupled to output 322 and input 312 will be coupled to output 320. Thus, at the output of circuit 300, the states of BL and $\overline{BL}$ will appear exactly the same as before the power loss and, hence, the read path circuitry will determine that the cell of the memory core stores a logic 1 (as will the case before the power loss).

Thus, circuit 300 provides for automatically recovering the data state stored in an NV memory cell prior to a power loss and eliminates the need for a "dummy" storage and recall operation. This functionally is achieved, in the illustrated embodiment, through crossing circuit 306 and passing circuit 308.

The crossing circuit 306 includes logic elements 411 and 412. The logic elements may be n-channel transistors and are gated by control signal 314. In operation, when control signal 314 is active (logic high), input 310 is coupled to output 322 and input 312 is coupled to output 320. Other types of transistors (e.g., p-channel transistors) may be used for logic elements 411 and 412 so long as this overall functionality is maintained.

The passing circuit 308 includes logic elements 414 and 416, which again may be n-channel transistors. Logic element 414 is gated by control signal 316 and, when control signal 316 is active (logic high), couples input 310 to output 320. Similarly logic element 416 is gated by control signal 316 and, when control signal 316 is active, couples input 312 to output 322. Again, other types of transistors or logic elements may be used so long as this functionality is preserved.

Figure 7:
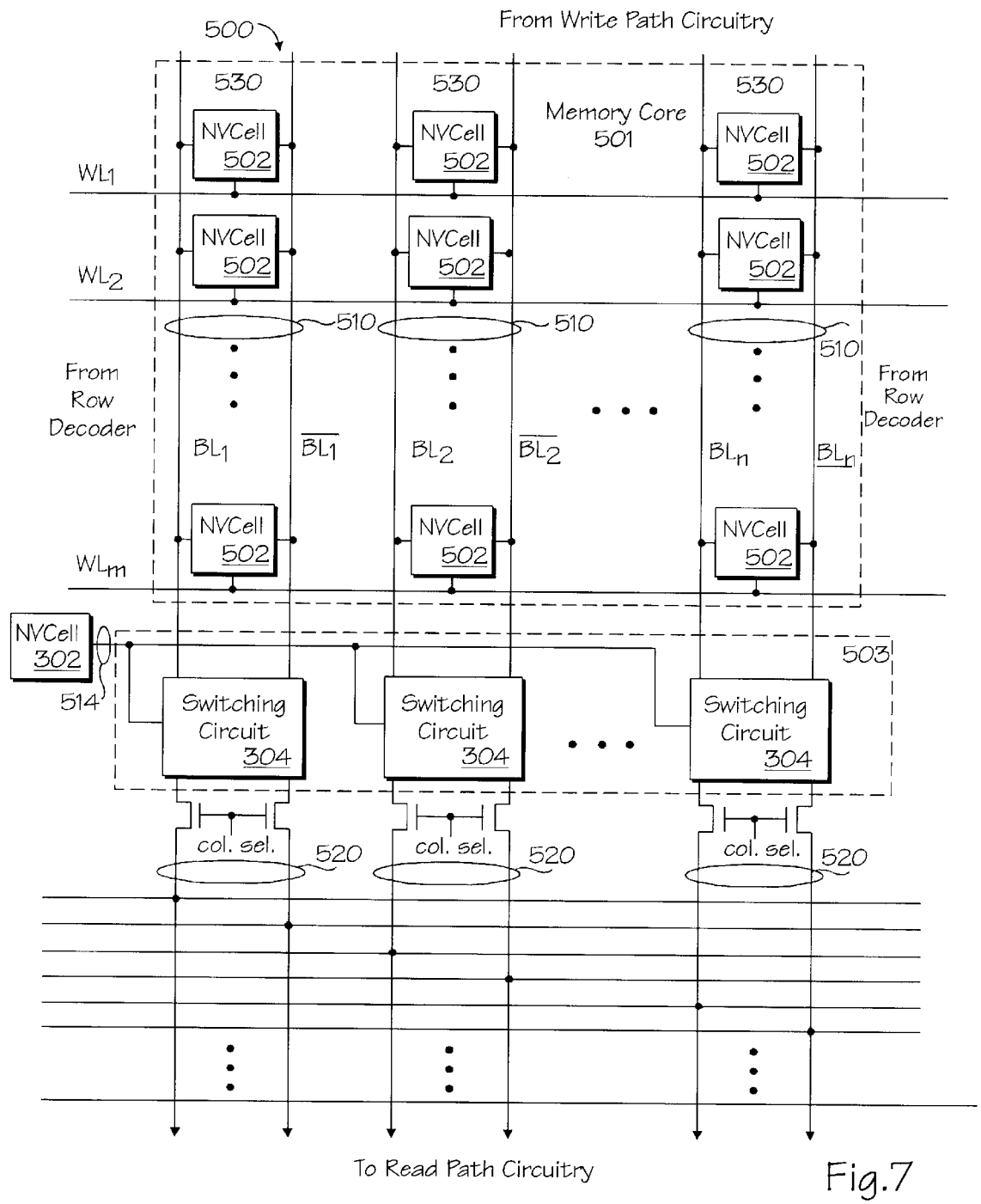
FIG. 7 illustrates a memory having a number of non-volatile SRAM cells and switching circuits according to a further embodiment of the present invention.

FIG. 7 illustrates a memory 500 which is an embodiment of present invention. Memory 500 includes a bitline switcher 503 that contains n switching circuits 304 coupled to a memory core 501 which contains m rows by n columns of NVCells 502. The NVCells 502 are individually selected by wordlines WL$_{1 \ldots m}$ and bitlines BLx $\overline{BLx}$, x=1–n in the conventional fashion. All NVCells 502 associated with an individual column of memory core 501 share a pair of bitlines 510. Each pair of bitlines 510 are coupled to a respective switching circuit 304 in the bitline switcher 501 which operate under the control of control device 302.

Each switching circuit 304 is configured to receive a pair of bitlines 510 from a column 530 as inputs. Each switching circuit 304 provides output signals on bitlines 520 (when bitlines are selected) according to state of a control signal 514. The signals on bitlines 520 are used by the read path circuitry of memory 500 to determine the data stored in NVCells 502 of the memory core 501.

The control device 302 may be an NVCell and may store a reference state indicating states of NVCells 502 in the memory core 501 before a power loss. The control device 302 is configured to generate control signal 514 in response to the reference state. The control signal 514 is provided to each switching circuit 304 and may be buffered to increase fan out capability for controlling large numbers of switching circuits 304.

Figure 8:
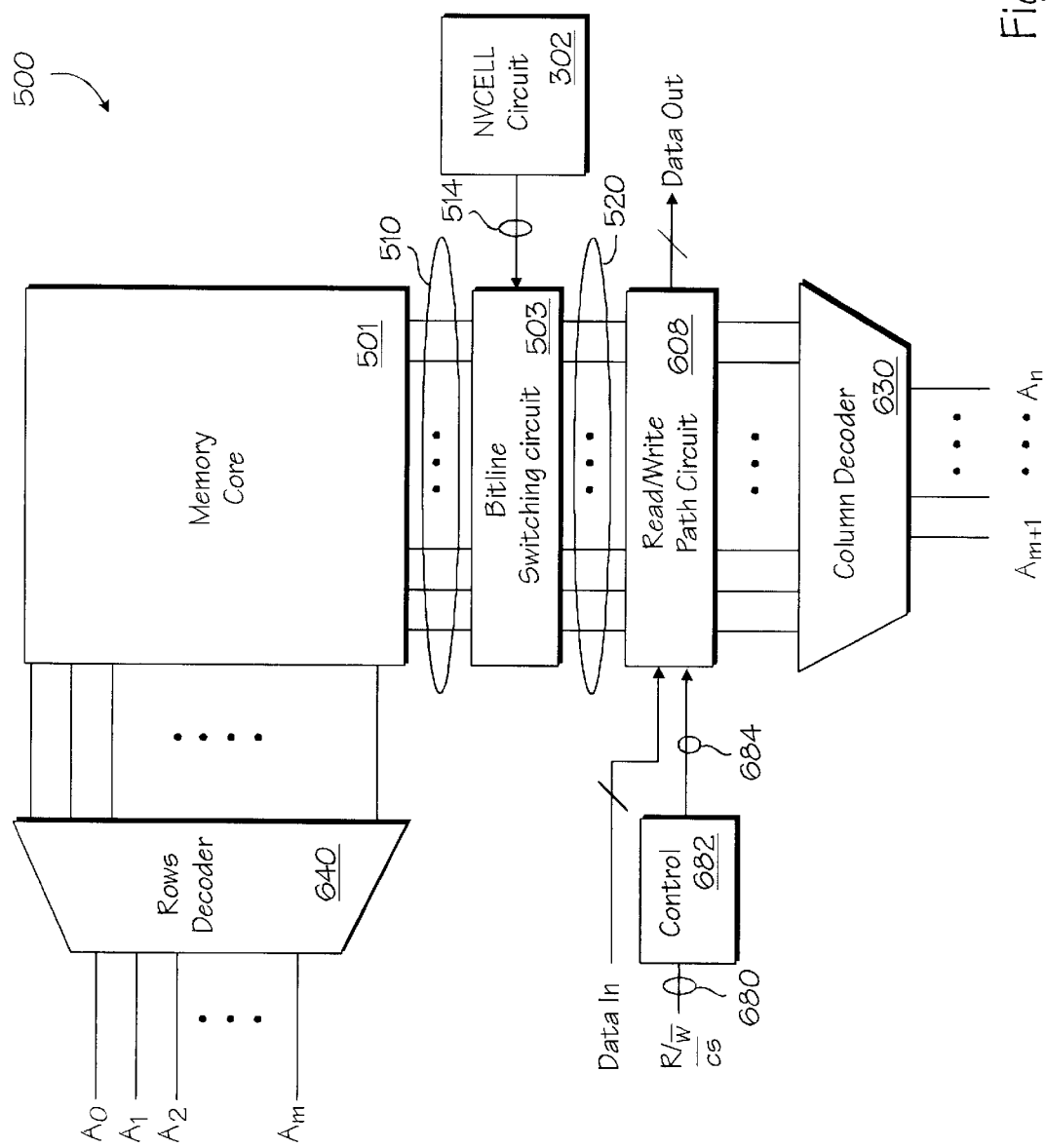
FIG. 8 illustrates a memory configured to automatically recover data stored in one or more non-volatile SRAM cells according to yet another embodiment of the present invention.

FIG. 8 further illustrates memory 500, which may be used in a computer system. As shown, bitline switcher 503 is coupled in a bitline path between memory core 501 and read path circuitry 608. During a read operation, control signals 680 are provided to control unit 682. Control unit 682 generates a read control signal 684 which activates read path circuit 608. In response, read path circuit 608 senses the states of bitline 612 which provide signals from selected memory cells of memory core 501. The selected cells of memory core 501 are accessed in the conventional fashion using column decoder 630 and row decoder 640. Read path circuitry 608 then provides data out signal 678. When desired, the states of the memory cells 502 of memory core 501 may be stored by raising their operating voltage to a programming voltage level. At the same time, the state of NVCell 302 may be stored in a similar fashion. Then, in the event of a power loss and restoration, the cells 502 of memory core 501 will power up in a logically inverse state to that which was stored. So too will NVCell 302 power up in a logically inverse state to that which it stored prior to the power loss. As a result signal 514 will have a logical compliment state to that which it had prior to the power loss and switching circuits 304 of bitline switches 503 will provide bitline coupling (inputs to outputs) opposite to that which was provided prior to the power loss. The overall result is that the read path circuitry 608 will be provided with signals on bitlines 520 which have the same state as was present prior to the power loss. Accordingly, the data states stored in cells 502 of memory core 501 will be read as being the same as were present prior to the power loss—all without the need for a dummy storage and recall operation.

The above operation is summarized in Table 1 below.

TABLE 1

| Logic State Stored by cells | BL | $\overline{BL}$ | State stored by Control Circuit | Control Signal | State seen by Read Path Circuit |
|---|---|---|---|---|---|
| Case 1 | | | | | |
| Prior to Power Loss | 1 | +ve | −ve | 1 | 1 | 1 |

TABLE 1-continued

| Logic State Stored by cells | BL | $\overline{BL}$ | State stored by Control Circuit | Control Signal | State seen by Read Path Circuit |
|---|---|---|---|---|---|
| After Power Restoration | 0 | −ve | +ve | 0 | 0 | 0 |
| Case 2 | | | | | |
| Prior to Power Loss | 0 | −ve | +ve | 1 | 1 | 1 |
| After Power Restoration | 1 | +ve | −ve | 0 | 0 | 0 |

As indicated, if prior to a power loss, a logic 1 is stored in the memory cells 502 of memory 500, bitlines BL will be more positive then bitlines $\overline{BL}$ at the inputs of respective switching circuit 302 of bitline switches 503. Switching circuits 302 will pass this state to the read path circuits 608 under the control of control signal 514. Control signal 514 is produced by control circuit 302, so when control circuit 302 stores a logic 1, control signal 514 is also a logic 1.

After power loss and restoration, cells 502 power up in their logically inverse state and now store a logic 0. So too does control circuit 302 power up in its logically inverse state and provides a logically inverse control signal 514. This control signal 514 is provided to switching circuits 302, which now provide an opposite coupling for the bitlines to that provided prior to the power loss. However, the state seen by the read path circuits remains the same.

Returning to FIG. 5, it should now be apparent that one embodiment of the present invention provides a circuit, e.g., switching circuit 304, which is configured to be responsive to a control signal and to provide bitline outputs (e.g., 320 and 322) in response to bitline inputs (e.g., 310 and 312) depending on the states of the bitline inputs and the control signal. However, the data correction architecture of the present invention encompasses more then just circuit 300 of FIG. 5. For example, FIG. 9 illustrates an alternative circuit for automatically correcting data in accordance with a further embodiment of the present invention.

Figure 9:
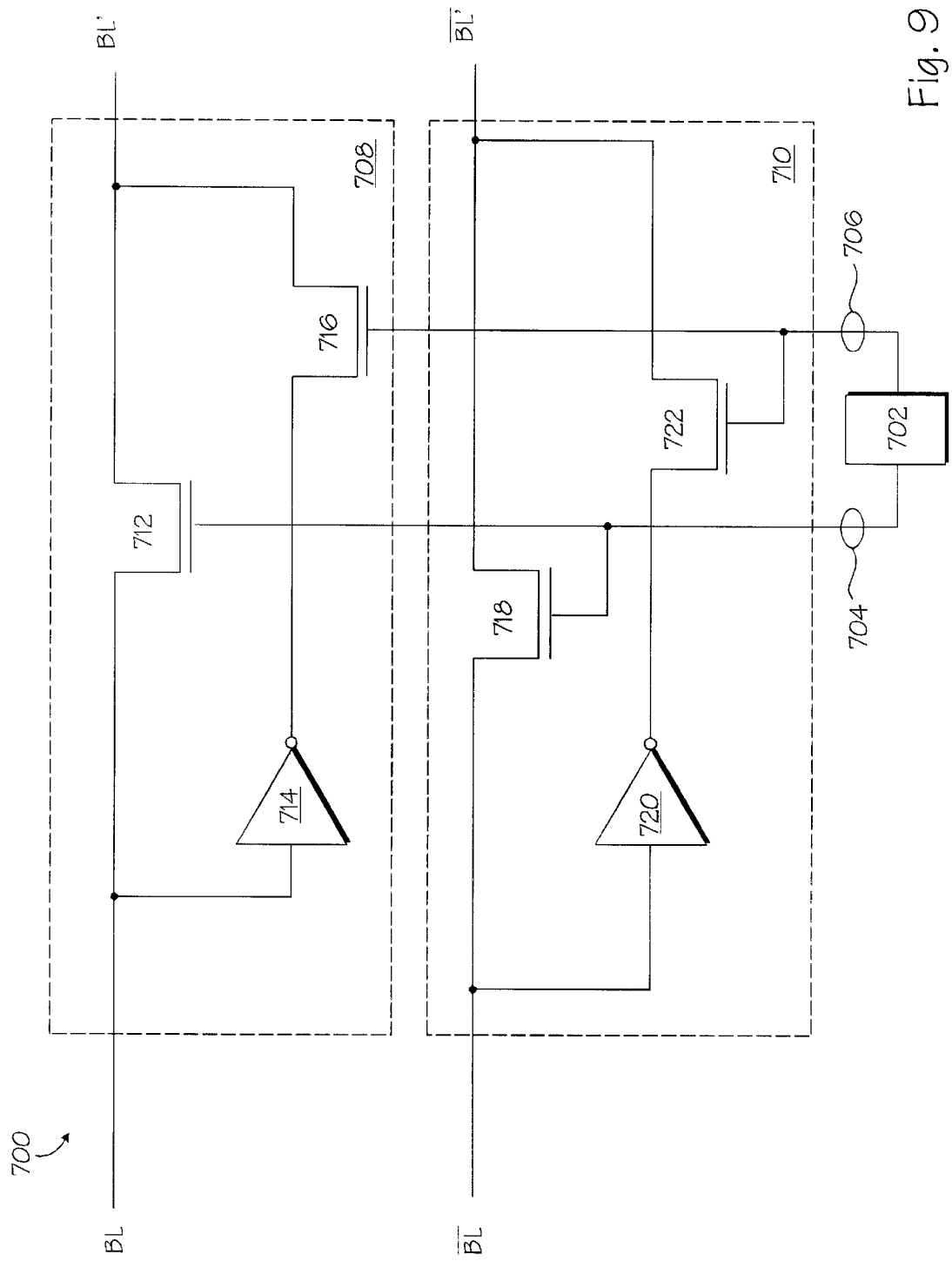
FIG. 9 illustrates an alternative circuit for automatically correcting data in accordance with a further embodiment of the present invention.

FIG. 9 shows a circuit 700 which is also configured to be response to a control signal and to provide bitline outputs (e.g., BL' and $\overline{BL'}$) in response to bitline inputs (e.g., BL and $\overline{BL}$). The states of the bitline outputs depend on the states of the bitline inputs, and the state of the control signal. For the particular embodiment illustrated in FIG. 9, a control device 702, which may be a non-volatile static random access memory cell as described above, provides two control signals, 704 and 706. However, as was discussed above, a single control signal may be provided and logically inverted, if necessary.

Circuit 700 includes two control devices 708 and 710 coupled between the bitline inputs and outputs. In particular, control device 708 is coupled between bitline input BL and bitline output BL', while control device 710 is coupled between bitline input $\overline{BL}$ and bitline output $\overline{BL'}$. It should be appreciated that bitline inputs BL and $\overline{BL}$ may be provided by a memory cell (e.g., an NVRAM cell) of a memory core in a memory device of a computer system. In such a case, bitline outputs BL' and $\overline{BL'}$ may be provided by circuit 700 to the read path circuitry of the memory device. Each of the control devices 708 and 710 are coupled to receive control signals 704 and 706.

In general, each of the control devices 708 and 710 provide non-inverting bitline paths between the bitline inputs and the bitline outputs and inverting bitline paths between the bitline inputs and the bitline outputs. For control device 708, the non-inverting bitline path between bitline input BL and bitline output BL' is through transistor 712. The inverting bitline path between BL and BL' is through inverter 714 and transistor 716. When control signal 704 is logic high (and, necessarily, control signal 706 is logic low), the non-inverting bitline path between BL and BL' is selected. Conversely, when control signal 706 is logic high (and control signal 704 is logic low), the inverting bitline path between BL and BL' is selected. When the inverting bitline with is selected, the state of bitline output BL' is the logical opposite of the state of bitline input BL.

Similarly, for control device 710, the non-inverting bitline path between bitline input $\overline{BL}$ and bitline output $\overline{BL'}$ is through transistor 718. The inverting bitline path between $\overline{BL}$ and $\overline{BL'}$ is through inverter 720 and transistor 722. When control signal 704 is a logic high, the non-inverting path between $\overline{BL}$ and $\overline{BL'}$ is selected. When control signal 706 is a logic high, the inverting path between $\overline{BL}$ and $\overline{BL'}$ is selected. When the inverting bitline path is selected, the state of bitline output $\overline{BL'}$ is the logical opposite of the state of bitline input $\overline{BL'}$.

It should be readily apparent that circuit 700, like circuit 300 of FIG. 5, allows for configuring the bitline outputs of a memory cell to reflect a state stored in the memory cell prior to a power loss. For example, assume that prior to the power loss, a memory cell (or, more preferably an NVRAM cell) which provides bitline inputs BL and $\overline{BL}$ to circuit 700 stores a logic 1. After a power loss and subsequent power up, the memory cell may now store a logic 0. Thus, the states of bitline inputs BL and $\overline{BL}$ will be the logic opposites of the states which were provided prior to the power loss. To correct this apparent data inversion, circuit 700, under the control of control signals 704 and 706 (which will also power up in states logically inverse to those which were provided to circuit 700 prior to the power loss), will provide bitline outputs BL' and $\overline{BL'}$ in the same states as before the power loss. Thus, the read path circuitry of the memory device will still receive signals which indicate that the memory cell stores a logic 1 (as before the power loss). Rather than switching between coupling each bitline input to one or the other of the bitline outputs (as would be the case for circuit 300 of FIG. 5), circuit 700 accomplishes this data correction by switching between the inverting or non-inverting bitline paths of control circuits 708 and 710.

To further illustrate this operation, consider the case where, prior to the power loss, BL is more positive than $\overline{BL}$ (indicating an associated memory cell stores a logic 1) and control signal 704 is logic high. In such an instance, the non-inverting paths of control circuits 708 and 710 will be selected and bitline output BL' will be more positive than $\overline{BL'}$.

Now, after a power loss and subsequent restoration, the memory cell which stored a logic 1 now powers up as if it stored a logic 0. Consequently, BL will be less positive than $\overline{BL}$ when the subject cell is read. If not for the presence of circuit 700, read path circuitry in the memory device would indicate that a logic 0 was stored. However, because control device 702 also powers up in a logically inverse state from that which it had before the power loss, control signal 704 is now logic low, while control signal 706 is logic high. Thus, the inverting paths of each control circuit 708 and 710 are selected. As a result, bitline output BL' is more positive than bitline output $\overline{BL'}$, and the read path circuitry will indicate that the subject memory cell stores a logic 1 (as was the case before the power loss). Circuit 700 thereby provides the same functionality as circuit 300 and as set forth in Table 1 above.

An architecture for correcting data in an NVRAM and methods for using same have been described. Although the foregoing description was set forth with reference to certain illustrated embodiments, it should be appreciated that the present invention is in no way limited to these examples and that the invention should only be measured in terms of the claims that follow.

What is claimed is:

1. A circuit having first and second inputs and first and second outputs, the circuit comprising:

a crossing circuit configured to connect the first input to the second output and the second input to the first output in response to a first control signal and including a first logic element coupled to receive a first input signal and configured to generate a second output signal in response to the first control signal, and a second logic element coupled to receive a second input signal and configured to generate a first output signal in response to the first control signal; and a passing circuit configured to connect the first input to the first output and the second input to the second output in response to the second control signal, the first and second control signals representing states of a control device.

2. The circuit of claim 1, wherein the passing circuit is configured to generate third and fourth output signals in response to the second control signal.

3. The circuit of claim 2, wherein the passing circuit comprises:

a third logic element coupled to receive a third input signal and configured to generate the third output signal in response to the second control signal; and a fourth logic element coupled to receive a fourth input signal and configured to generate the fourth output signal in response to the second control signal.

4. The circuit of claim 1, wherein the control device comprises a memory cell.

5. The circuit of claim 4, wherein the memory cell comprises a non-volatile RAM cell.

6. The circuit of claim 5, wherein the first and second control signals correspond to a logic state stored in the memory cell.

7. The circuit of claim 6, wherein the first control signal is a logical complement of the second control signal.

8. A circuit configured to provide first or second bit-line connection paths according to logic states of a control signal, the first and second bit-line connection paths providing pass-through and cross-coupled connection paths, respectively.

9. The circuit of claim 8, comprising a crossing circuit configured to provide the first bit-line connection path according to a first logic state of the control signal.

10. The circuit of claim 9, comprising a passing circuit configured to provide the second bit-line connection path according to a second logic state of the control signal.

11. The circuit of claim 10 comprising a memory cell configured to generate the control signal.

12. The circuit of claim 11, wherein the memory cell comprises a non-volatile memory cell.

13. A method comprising connecting a first input of a circuit to a first or second output of the circuit in response to a first control signal provided by a memory cell.

14. The method of claim 13 further comprising connecting a second input of the circuit to the second output of the circuit in response to a second control signal provided by the memory cell.

15. The method of claim 14, wherein the memory cell provides the first and second control signals according to states stored in the memory cell.

16. The method of claim 15, further comprising storing a reference state in the memory cell before power loss.

17. A system comprising:
 a memory core;
 a memory cell; and
 a circuit coupled to the memory cell having a first input coupled to the memory core and a second output, the circuit configured to connect the first input to the second output in response to a first control signal, the first control signal representing a first state of the memory cell.

18. The system of claim 17 wherein the circuit comprises a crossing circuit configured to connect the first input and a second input to the second and a first outputs, respectively, in response to the first control signal.

19. The system of claim 18 wherein the circuit further comprises a passing circuit configured to connect the first and second inputs to the first and second outputs, respectively, in response to a second control signal, the second control signal representing a second state of the memory cell.

20. A computer system comprising the system of claim 17.

21. The computer system of claim 20, wherein the memory core comprises a plurality of non-volatile RAM cells.

22. The system of claim 17, wherein the memory cell comprises a non-volatile memory cell.

23. A circuit configured to be responsive to a control signal provided by a non-volatile SRAM cell and to provide bitline outputs in response to bitline inputs, the states of the bitline outputs depending on the states of the bitline inputs and the control signal, the circuit comprising a first control device coupled between a first of the bitline inputs and a first of the bitline outputs and a second control device coupled between a second of the bitline inputs and a second of the bitline outputs, the first and second control devices being coupled to receive the control signal.

24. The circuit of claim 23 wherein the first control device comprises a non-inverting bitline path and an inverting bitline path.

25. The circuit of claim 23 wherein the first control device comprises a crossing circuit and the second control device comprises a passing circuit.

26. A memory device comprising the circuit of claim 23.

27. A computer system comprising the memory device of claim 26.

* * * * *